(12) United States Patent
Chen et al.

(10) Patent No.: US 11,251,346 B2
(45) Date of Patent: Feb. 15, 2022

(54) LIGHT EMITTING DIODE PACKAGE STRUCTURE

(71) Applicants: LITE-ON OPTO TECHNOLOGY (CHANGZHOU) CO., LTD., Changzhou (CN); LITE-ON TECHNOLOGY CORPORATION, Taipei (TW)

(72) Inventors: Hung-Jui Chen, New Taipei (TW); Po-Jui Lin, New Taipei (TW)

(73) Assignees: LITE-ON OPTO TECHNOLOGY (CHANGZHOU) CO., LTD., Changzhou (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 16/999,310

(22) Filed: Aug. 21, 2020

(65) Prior Publication Data
US 2021/0057618 A1   Feb. 25, 2021

(30) Foreign Application Priority Data

Aug. 23, 2019 (CN) .......................... 201910785516.4
Nov. 19, 2019 (CN) .......................... 201911137385.5

(51) Int. Cl.
*H01L 33/54* (2010.01)
*H01L 23/00* (2006.01)
(Continued)

(52) U.S. Cl.
CPC .............. *H01L 33/54* (2013.01); *H01L 24/48* (2013.01); *H01L 33/60* (2013.01); *H01L 33/62* (2013.01);
(Continued)

(58) Field of Classification Search
CPC ......... H01L 33/54; H01L 33/60; H01L 33/56; H01L 24/48; H01L 24/45; H01L 2224/48227; H01L 2224/73265
See application file for complete search history.

(56) References Cited

U.S. PATENT DOCUMENTS

2013/0307004 A1* 11/2013 Weidner ................. H01L 24/18
257/98
2014/0226345 A1*  8/2014 Song .................... H01L 33/62
362/382
2019/0267519 A1*  8/2019 Nagel .................... H01L 33/54

FOREIGN PATENT DOCUMENTS

CN       102694102 A      9/2012
CN       103137827 A      6/2013
(Continued)

*Primary Examiner* — Marcos D. Pizarro
*Assistant Examiner* — Antonio B Crite
(74) *Attorney, Agent, or Firm* — Li & Cai Intellectual Property (USA) Office

(57) ABSTRACT

A light emitting diode (LED) package structure is provided and includes a substrate, an LED chip and a reflective component. The substrate has a first and a second region, and the substrate includes at least one electrode pad disposed on the second region. The LED chip is disposed on the substrate and has a chip upper surface with a light emitting region and a wire bonding region. The LED chip includes at least one electrode contact located at the wire bonding region and is electrically connected to the at least one electrode pad via a metal wire. The reflective component includes a first portion and a second portion. The first portion includes a first surface flush with the light emitting region and the second portion includes a second surface above a highest point of the metal wire.

14 Claims, 15 Drawing Sheets

(51) Int. Cl.
*H01L 33/60* (2010.01)
*H01L 33/62* (2010.01)
*H01L 25/16* (2006.01)
*H01L 33/50* (2010.01)
*H01L 33/56* (2010.01)

(52) U.S. Cl.
CPC .......... *H01L 25/167* (2013.01); *H01L 33/507* (2013.01); *H01L 2224/48227* (2013.01)

(56) References Cited

FOREIGN PATENT DOCUMENTS

| | | |
|---|---|---|
| CN | 206332055 U | 7/2017 |
| KR | 1020150111103 A | 10/2015 |

\* cited by examiner

LIGHT EMITTING DIODE PACKAGE STRUCTURE

CROSS-REFERENCE TO RELATED PATENT APPLICATION

This application claims the benefit of priority to No. 201910785516.4, filed on Aug. 23, 2019 and No. 201911137385.5, filed on Nov. 19, 2019 in People's Republic of China. The entire content of the above identified application is incorporated herein by reference.
Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light emitting diode (LED) package structure, and more particularly to an LED package structure capable of enhancing central illuminance.

BACKGROUND OF THE DISCLOSURE

A light emitting diode (LED) is a light emitting component using a semiconductor as a light emitting material. The luminous efficiency of the LEDs has been gradually improved, and the applicable range of the LEDs has been gradually expanded. The characteristics of high efficiency and long life of LED lamps can greatly save costs and reduce energy consumption.
However, in the application of ultra-high-power outdoor LED lamps, there are still many restrictions when developing the ultra-high-power outdoor LED lamps. If new LED lamp design and technologies can replace existing commercially available high-intensity discharge (HID) lamps, the LED lighting industry will enter a new phase.
In the existing technology, one type of LED package structure is chip-installing and wire bonded, and then packaged by molding. In this process, metal wire breakage is a frequent issue. Therefore, there is a need to design a new type of the LED package structure to avoid the breakage of the metal wires, adjust the viewing angle of the LED and improve the central illumination of the LED at the same time.

SUMMARY OF THE DISCLOSURE

The present disclosure provides an LED package structure to prevent the breakage of a metal wire while manufacturing and increase the central illumination of the LED. An LED package structure and a manufacturing method thereof are provided in accordance with the drawback of the conventional technique.
In response to the above-referenced technical inadequacies, a light emitting diode (LED) package structure includes a substrate, an LED chip and a reflective component. The substrate has a first region and a second region, and the substrate includes at least one electrode pad disposed on the second region. The LED chip is disposed on the substrate and has a chip upper surface with a light emitting region corresponding to the first region and a wire bonding area corresponding to the second region, and the LED chip includes at least one electrode contact located at the wire bonding region and is electrically connected to the at least one electrode pad via at least one metal wire. The reflective component includes a first portion surrounding the LED chip and a second portion correspondingly disposed on the second region, and the second portion covers a portion of the first region and the wire bonding region. The first portion includes a first surface being flush with the light emitting region, and the second portion includes a second surface above the highest point of the at least one metal wire.
In one aspect, the LED package structure further includes a transmissive element covering the reflective component and the light emitting region.
In one aspect, the LED package structure further includes a transmissive element disposed on the first region and the light emitting region.
In one aspect, the LED package structure further includes a phosphor layer covering the LED chip.
In one aspect, the phosphor layer covers the light emitting region and the first surface.
In one aspect, the reflective component includes reflective particles.
In one aspect, a lateral side of the reflective component is a stepped structure.
In one aspect, an upper surface of the second portion has a square shape, a rectangle shape, a trapezoid shape or a polygon shape.
In one aspect, a ratio between an area of the wire bonding region and the area of the light emitting region is less than 20%.
In one aspect, one lateral side of the light emitting region has a length equal to one lateral side of the wire bonding region.
In one aspect, the LED package structure further includes a lens disposed on the light emitting region.
One of the advantages of the present disclosure is that, the LED package structure and the manufacturing method thereof provided in the present disclosure can effectively prevent light leakage. The reflective component is implemented to cover the metal wire, thereby achieving the effect of protecting the metal wire from breaking. The purpose of narrowing the viewing angle is also achieved through the reflective component.
These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1A:
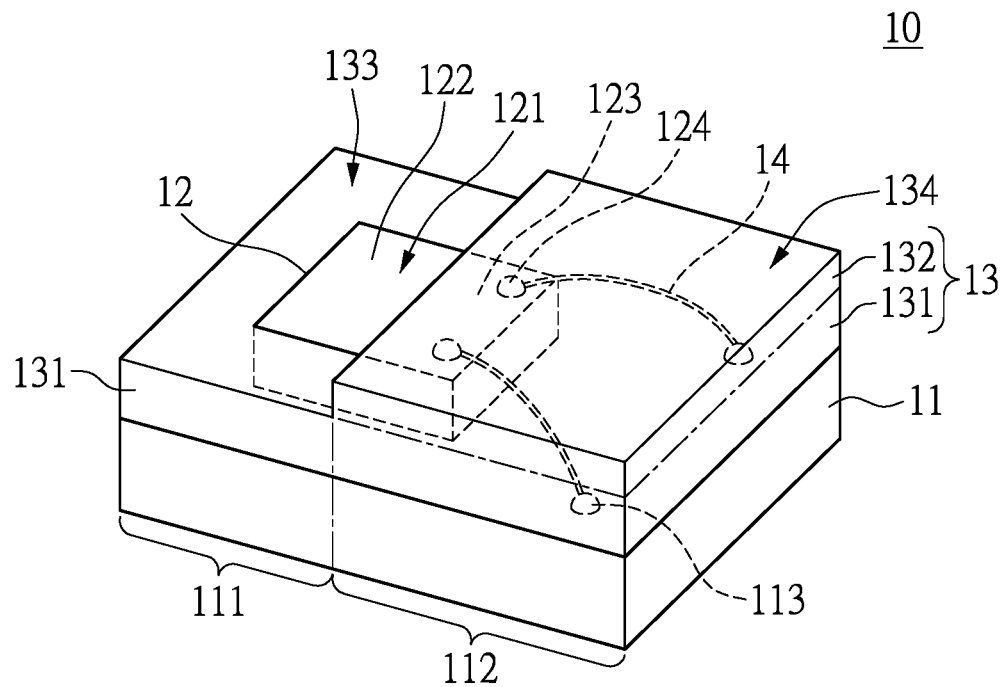
FIG. 1A is a schematic view of an LED package structure according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 1B:
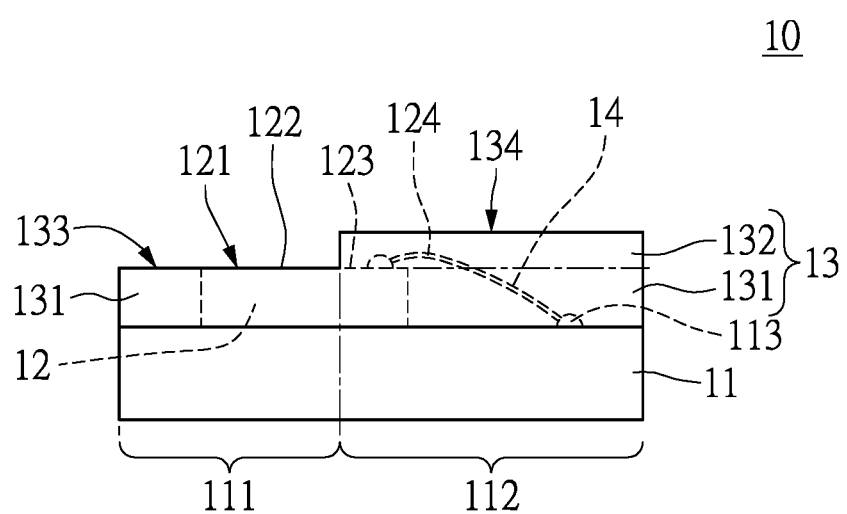
FIG. 1B is a side view of the LED package structure according to the embodiment of the present disclosure.

FIG. 1A is a schematic diagram of a light emitting diode (LED) package structure according to an embodiment of the present disclosure, and FIG. 1B is a side view of the light emitting diode package structure according to the embodiment of the present disclosure. As shown in FIG. 1A and FIG. 1B, in the embodiment of the present disclosure, the LED package structure 10 mainly includes a substrate 11, an LED chip 12 and a reflective component 13.

Moreover, the substrate 11 has a first region 111 and a second region 112, and also includes at least one electrode pad 113 disposed in the second region 112. The number of the electrode pads 113 may be one or more. The LED chip 12 is disposed across the first region 111 and the second region 112 of the substrate 11. Specifically, a portion of the LED chip 12 is disposed on the first region 111 of the substrate 11, and a portion of the LED chip 12 is disposed on the second region 112. The LED chip 12 has a chip upper surface 121, and the chip upper surface 121 includes a light emitting region 122 and a wire bonding region 123. The light emitting region 122 of the chip upper surface 121 corresponds to the first region 111 of the substrate 11, and the wire bonding region 123 of the chip upper surface 121 corresponds to the second region 112 of the substrate 11. The light emitted from the second region 112 of the LED chip 12 cannot be transmitted to the surface of the LED package structure 10 due to the subsequent shielding of a reflective component 13 disposed above the substrate 11 and the LED chip 12.

In addition, the LED chip 12 includes electrode contacts 124, and the electrode contacts 124 are located on the wire bonding region 123 of the chip upper surface 121. The electrode contacts 124 are electrically connected to the electrode pads 113 via the metal wire 14, and the number of the metal wire 14 or the number of the electrode contacts can be one or more, and the number thereof corresponds to the number of the electrode pads 113, but it is not limited thereto. The metal wire 14 is preferred to be a gold wire, but it is not limited thereto.

The reflective component 13 includes a first portion 131 and a second portion 132. The first portion 131 of the reflective component 13 surrounds the LED chip 12, and a first surface 133 of the first portion 131 being flush with the chip upper surface 121 (the light emitting region 122) of the LED chip 12. In other words, the thickness of the first portion 131 of the reflective component 13 is approximately the same as the thickness of the LED chip 12, so that the first portion 131 of the reflective component 13 is not too high to shield the light emitting path of the LED chip 12.

In addition, the first portion 131 of the reflective component 13 surrounds the LED chip 12 to prevent lateral light leakage from the LED chip 12, and can control the light emitting angle of the LED chip 12. The second portion 132 of the reflective component 13 is correspondingly disposed on the second region 112 of the substrate 11. The second portion 132 of the reflective component 13 is stacked on the first portion 131. The second portion 132 of the reflective component 13 covers the metal wire 14 at the second region 112 of the substrate 11. The second surface 134 of the second portion 132 of the reflective component 13 is above the highest point of the at least one metal wire 14, so that the second portion 132 of the reflective component 13 can protect the metal wire 14.

The reflective component 13 is preferably made of an opaque sealing material with reflective particles, such as titanium dioxide (TiO2) or boron nitride (BN). Furthermore, the reflective component 13 is preferably made of silicon or epoxy resin, but it is not limited thereto. In addition, the thickness of the first portion 131 of the substrate 11 is the same as the LED chip 12, so that the thickness of the second portion 132, which is stacked thereon, is preferably between 50 and 100 mm. Alternatively, in different embodiments, the first portion 131 is flush with the LED chip 12. The thickness of the second portion 132 stacked thereon is between 150 and 200 mm, but it is not limited thereto.

Figure 2A:
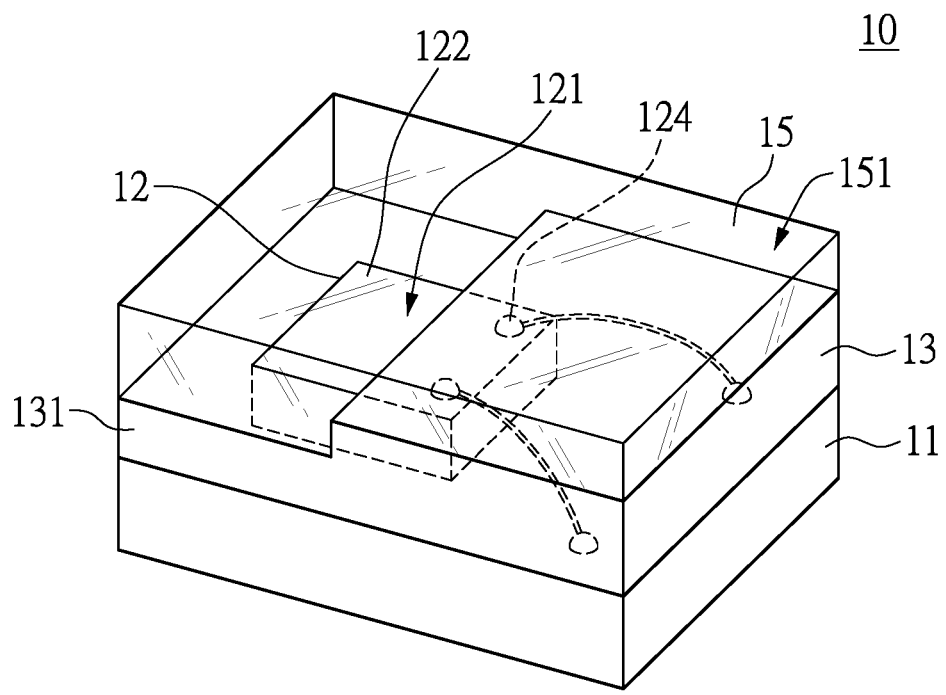
FIG. 2A and FIG. 2B are schematic views of the LED package structure including a transmissive element in the embodiment of the present disclosure.
Figure 2B:
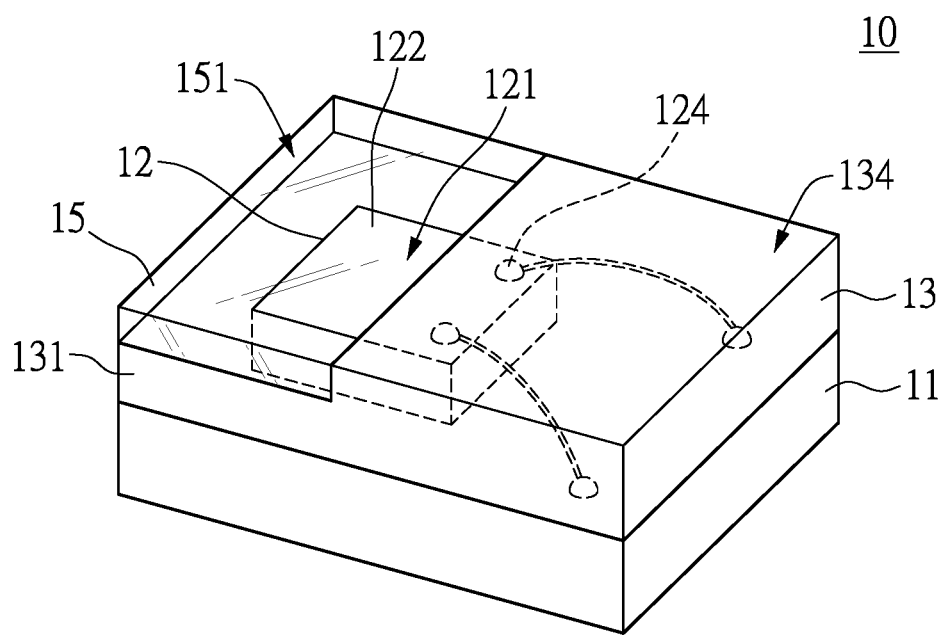
Figure 2C:
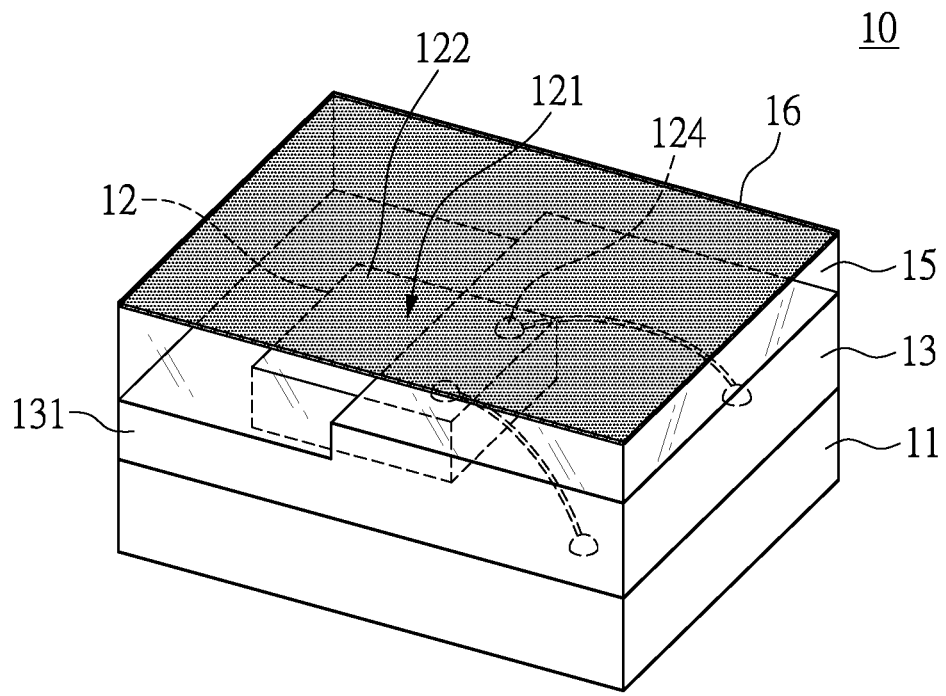
FIG. 2C to FIG. 2H are perspective schematic views of the LED packing structure including a phosphor layer in the present disclosure.

FIG. 2A and FIG. 2B are schematic diagrams of the LED package structure including a transmissive element in the embodiment of the present disclosure. As shown in FIG. 2A, in the embodiment of the present disclosure, the LED package structure 10 further includes a transmissive element 15 disposed on the reflective component 13 and covering the light emitting area 122 of the chip upper surface 121 of the LED chip 12. Specifically, the transmissive element 15 covers the first portion 131 of the reflective component 13 located in the first region 111, the second portion 132 of the reflective component 13 located in the second region 112, and the light emitting area 122 of the chip upper surface 121 of the LED chip 12.

Alternatively, in different embodiments, as shown in FIG. 2B, the transmissive element 15 covers the first surface 133 and the light emitting region 122 located in the first region 111 only, and the upper surface 151 of the transmissive element 15 is a planar surface being flush with the second surface 134 of the second portion 132 as shown in FIG. 2B. In different embodiments, the upper surface 151 of the transmissive element 15 may not be flush with the second surface 134 of the second portion 132, but it is not limited thereto.

In addition, the upper surface 151 of the transmissive element 15 may be a planar surface, or the upper surface 151 of the transmissive element 15 may be a spherical surface to improve the light emitting efficiency of the LED chip 12, but it is not limited thereto. Furthermore, for the LED chip 12 having a plurality of electrode contacts 124, the length of one lateral side of the light emitting region 122 is equal to the length of one lateral side of the wire bonding region 123 so as to provide sufficient area to accommodate all of the electrode contacts 124. The second portion 132 is able to cover all the electrode contacts 124 and the corresponding metal wire 14. In the preferred embodiment, in order to ensure luminous efficiency, the wire bonding region 123 needs to be smaller than the light emitting region 122. Preferably, the ratio between the area of the wire bonding region 123 and the area of the light emitting region 122 is less than 20%. If the area is too large, the light emitting region may be wasted. If the area is too small, it could not accommodate the electrode contacts 124.

Figure 2D:
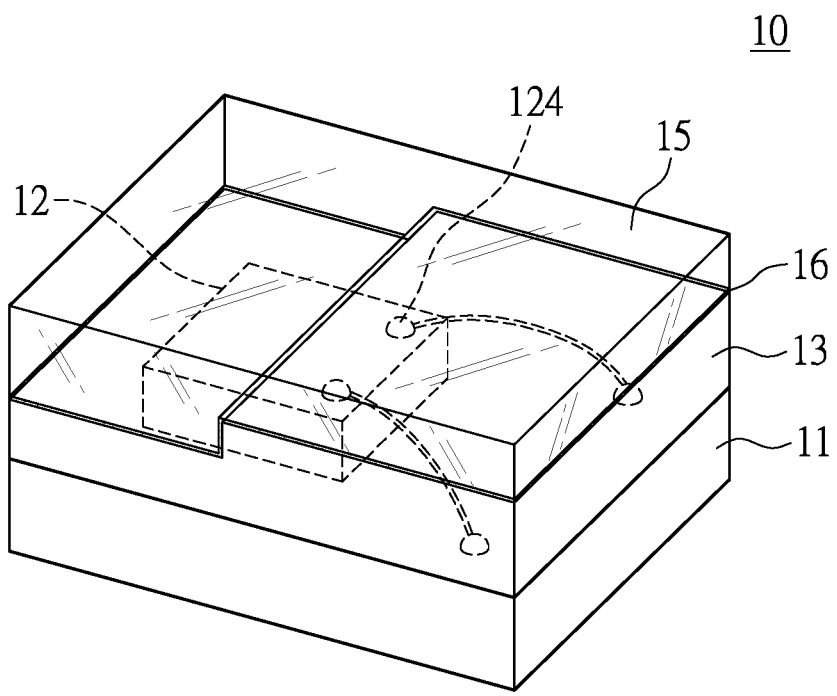

FIG. 2C to FIG. 2H are three-dimensional schematic diagrams of the LED packing structure including a phosphor layer in the present disclosure. In order to allow the LED package structure 10 to emit different colors of light, the LED package structure 10 in the present disclosure may further include a phosphor layer 16 disposed on the LED chip 12. For example, referring to FIG. 2C, the phosphor layer 16 is disposed on the transmissive element 15 and the LED chip 12. Alternatively, as shown in FIG. 2D, the phosphor layer 16 may be disposed on the light emitting region 122 of the upper surface 121 of the LED chip 12 and the reflective component 13. In some embodiments, the phosphor layer 16 may cover the light emitting region 122 of the upper surface 121 of the LED chip 12 as well as the first portion 131 and the second portion 132 of the reflective component 13 in advance, and then the transmissive element 15 is disposed on the phosphor layer 16. However, in some embodiments, which are not shown in the drawings, the phosphor layer 16 may cover the first region 111 only or the light emitting region 122 only, and then the transmissive element 15 is disposed on the first region 111 or on the first region 111 and the second region 112.

Figure 2E:
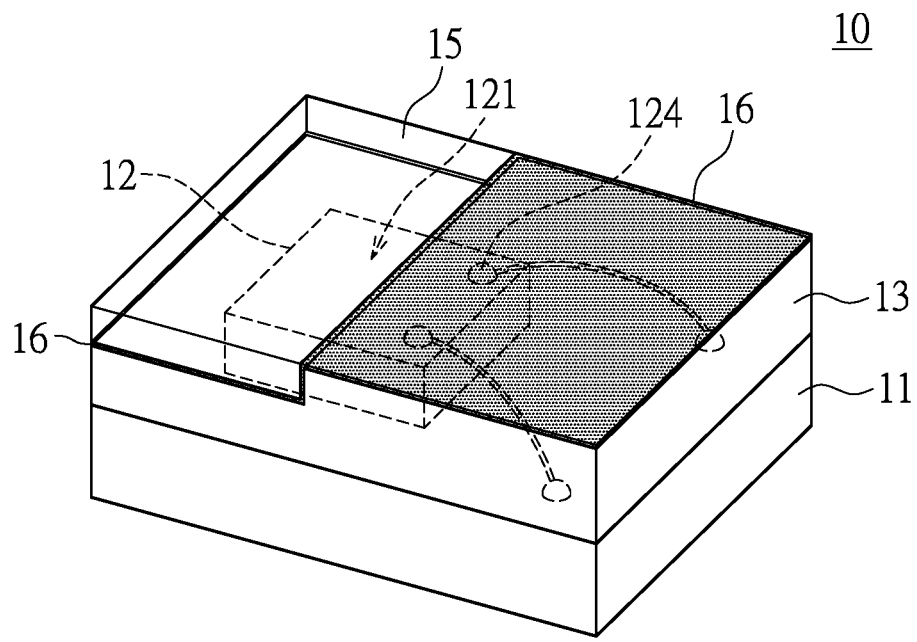
Figure 2F:
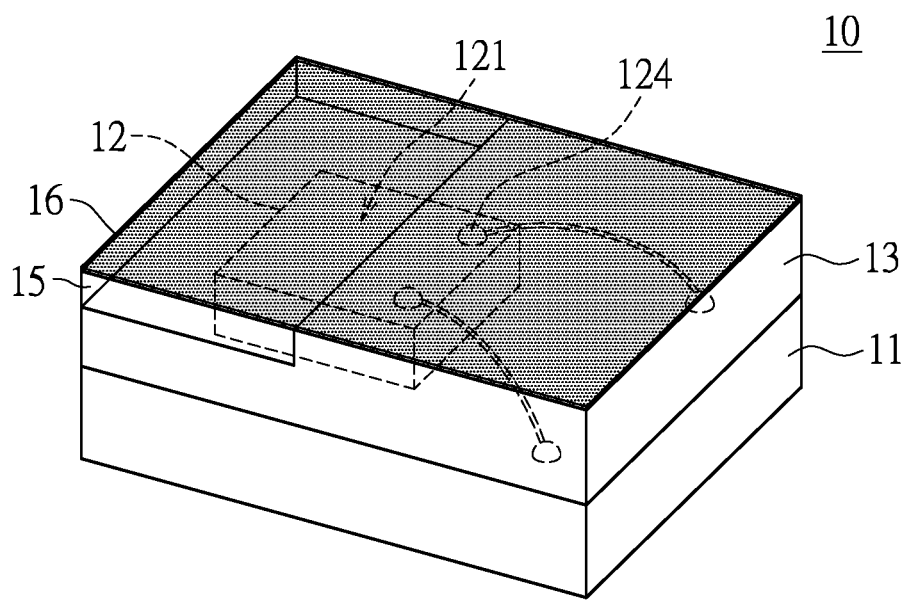
Figure 2G:
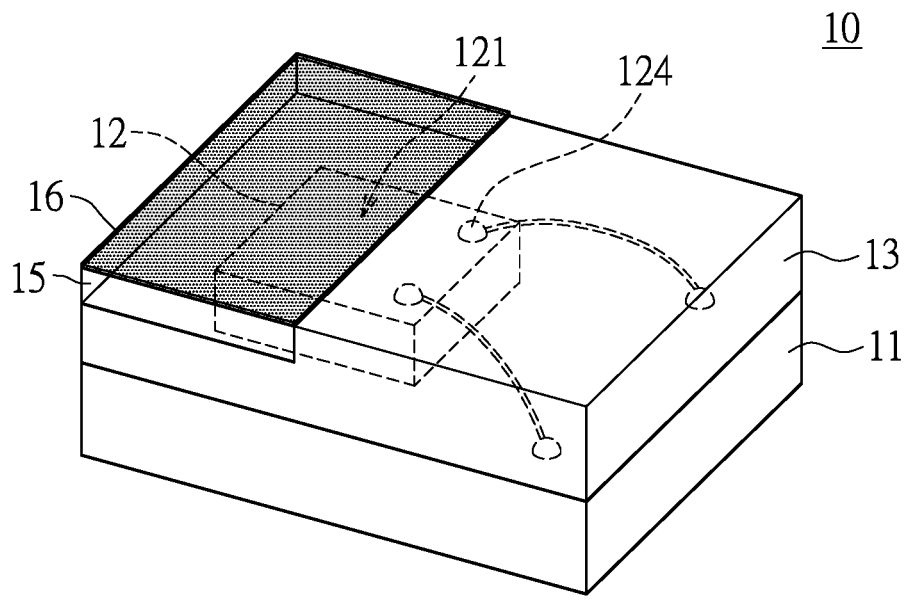
Figure 2H:
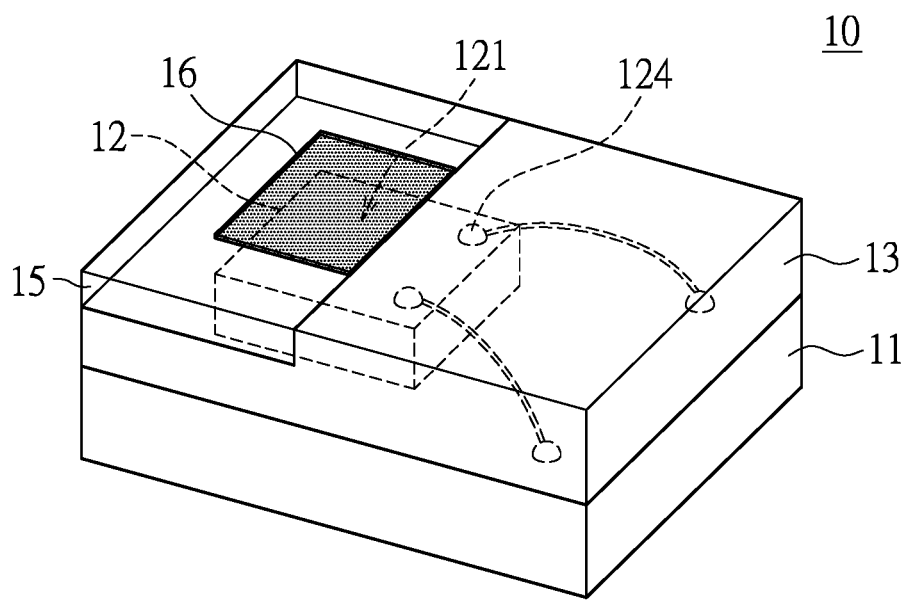

Alternatively, as shown in FIG. 2E, the phosphor layer 16 may be firstly disposed on the light emitting region 122 located at the first region 111 and the reflective component 13, and then the transmissive element 15 may be disposed on the phosphor layer 16 located at the first region 111 of the substrate 11. In addition, as shown in FIG. 2F, the phosphor layer 16 covers the transmissive element 15 located in the first region 111 of the substrate 11 and the second portion 132 of the reflective component 13, but it is not limited thereto. In addition, it should be noted that most of the LEDs can emit red, green, or blue light. If the LEDs are to emit white light, the LEDs are preferably used in combination with phosphors. For example, the blue LEDs are used in combination with yellow phosphor layers, and the yellow phosphor layer can be yttrium aluminum garnet phosphor, silicate phosphor or nitride phosphor, so that the LED package structure 10 is capable of emitting white light. In different embodiments, the phosphor layer 16 may be disposed only on the transmissive element 15 located in the first region 111, as shown in FIG. 2G, or the phosphor layer 16 may be formed only on the transmissive element 15 at the light emitting region 122 of chip upper surface 121 of the chip, as shown in FIG. 2H, but it is not limited thereto.

FIG. 3A to FIG. 3E are three-dimensional schematic views of the LED package structure in different embodiments of the present disclosure. Furthermore, in the different embodiments of the present disclosure, the second portion 132 of the reflective component 13 is not limited to include the shape shown in FIG. 2A to FIG. 2F, and the second portion 132 may have different shapes and volumes.

Figure 3A:
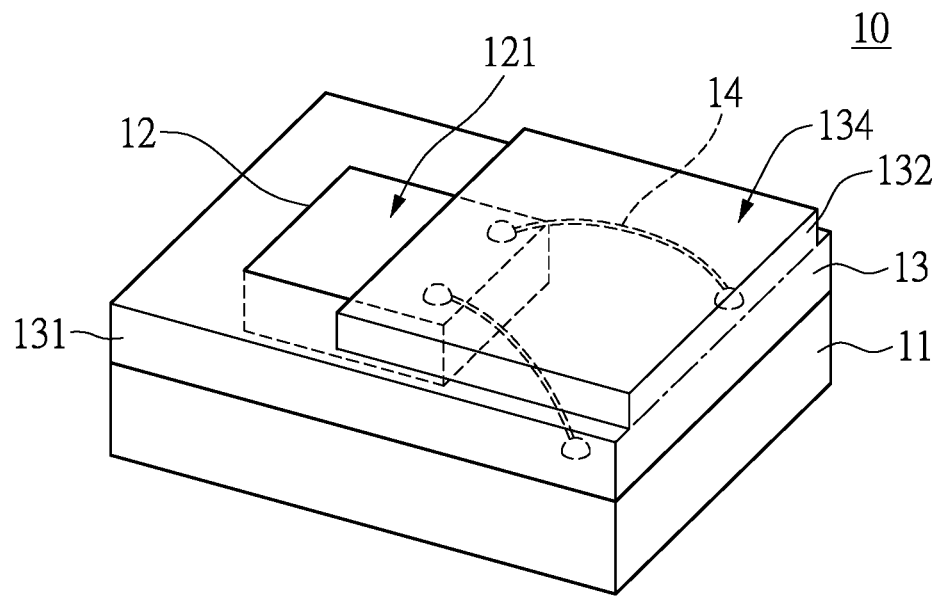
FIG. 3A to FIG. 3E are perspective views of the LED package structure in different embodiments of the present disclosure.
Figure 3B:
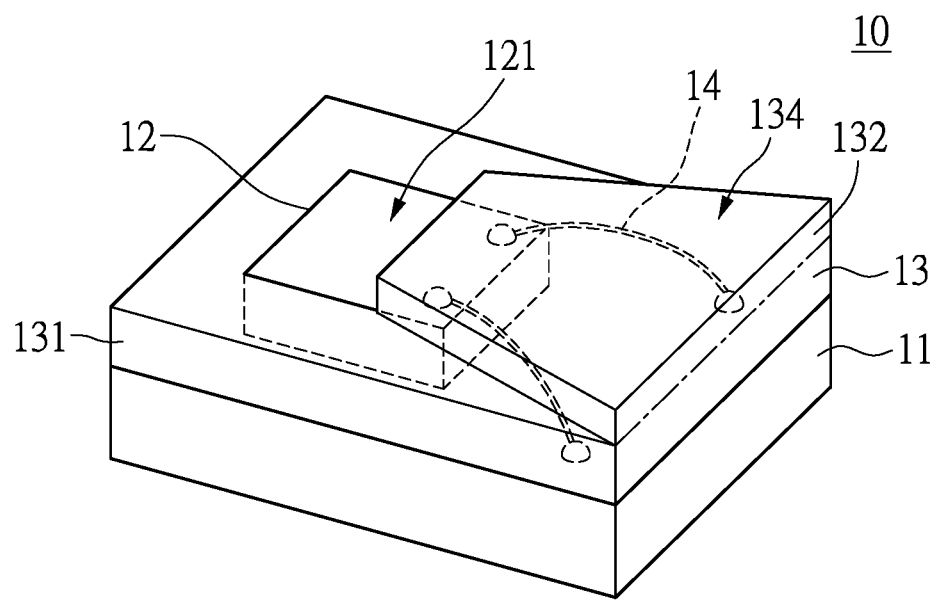
Figure 3C:
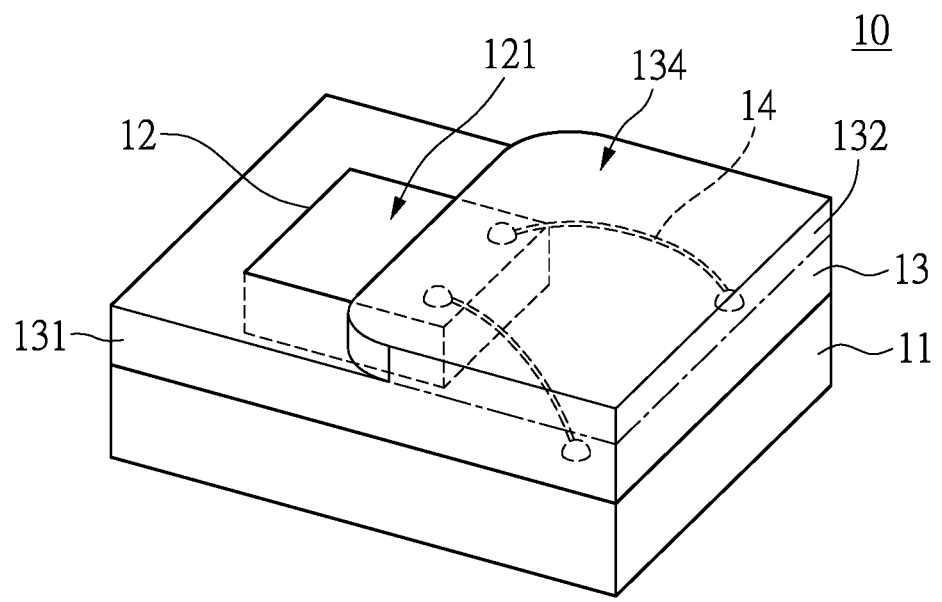
Figure 3D:
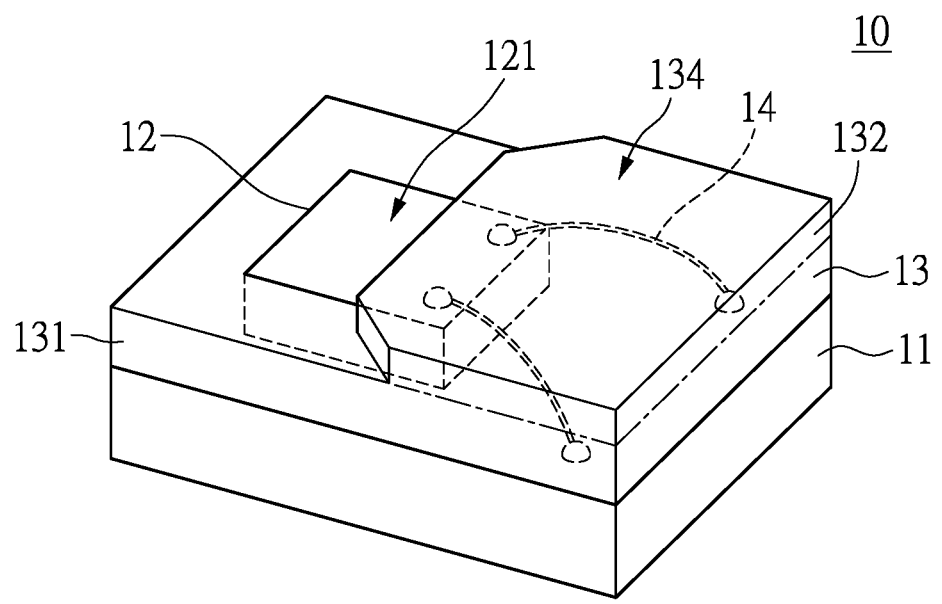
Figure 3E:
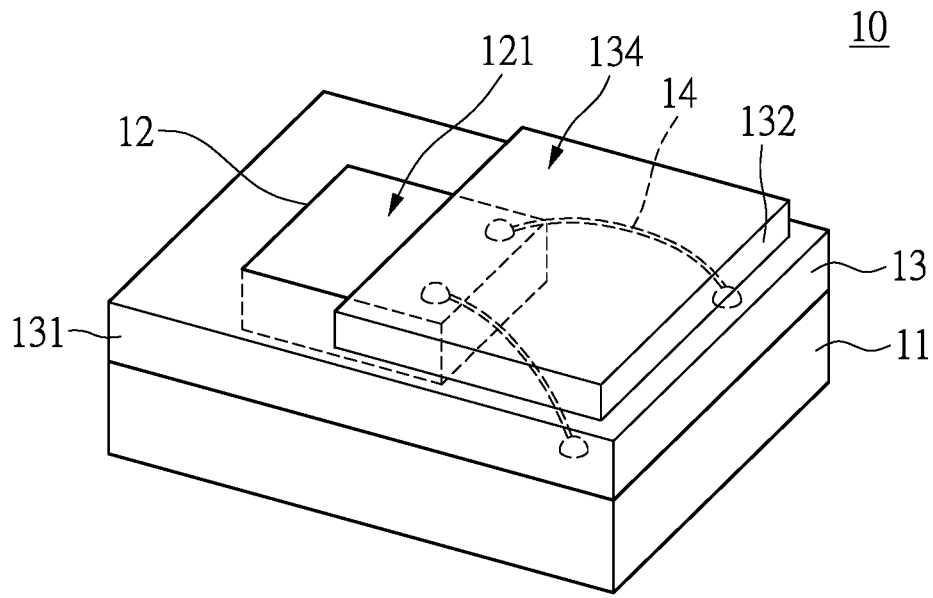

For example, as shown in FIG. 3A to FIG. 3E, the area of the second portion 132 of the reflective component 13 may be smaller than the area of the first portion 131 located in the second region 112, as shown in FIG. 3A. The second portion 132 may have a trapezoidal shape, as shown in FIG. 3B, and the second portion 132 may also have an irregular shape, as shown in FIG. 3C, or the second portion 132 of the reflective component 13 may have a polygonal shape, as shown in FIG. 3D.

It should be noted that the second portion 132 of the reflective component 13 of the LED package structure 10 in the present disclosure may has any shapes, e.g., a square shape, a rectangle shape, or a polygon shape, as long as the second surface 134 is above the highest point of the metal wire 14, and the second portion 132 of the reflective component 13 is capable of completely covering the metal wire 14, then it may be the reflective component 13 in the present disclosure.

Figure 4:
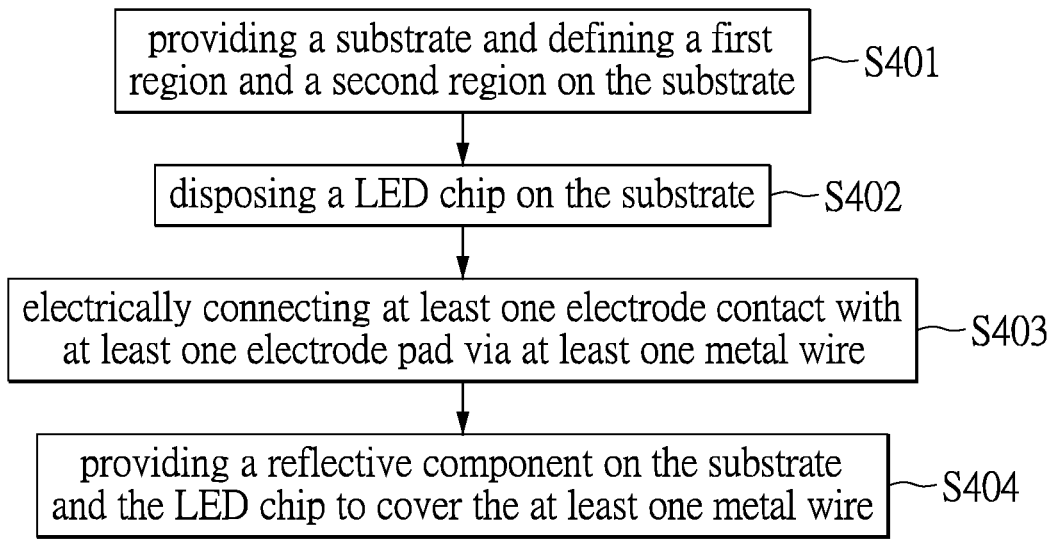
FIG. 4 is a flowchart illustrating a method for manufacturing the LED package structure in an embodiment of the present disclosure.

With reference to FIG. 4, FIG. 4 is a flowchart illustrating a method for manufacturing the LED package structure in an embodiment of the present disclosure. The numbers for the components described in the aforementioned LED package structure are used herein, and the method includes the following steps.

In step S401, a substrate 11 is provided, and a first region 111 and a second region 112 are defined on the substrate 11. In step S402, an LED chip 12 is disposed on the substrate 11. The substrate 11 includes electrode pads 113 disposed in the second region 112. The substrate 11 is preferably an aluminum substrate, a copper substrate or a ceramic circuit board, but it is not limited thereto. The first region 111 is the light emitting region of the LED chip 12, and the second region 112 is the sacrificial region of the LED chip 12, that is, the light at the second region 112 of the LED chip 12 cannot be transmitted to the surface of the LED package structure 10 because of the shielding of other hierarchical structures.

Moreover, the substrate 11 includes an electrode pad 113, and the electrode pad 113 is electrically connected to the LED chip 12. In addition, during the process of disposing the LED chip, a protection component can also be provided at the same time. The protection component is preferably a Zener diode, and the LED chip 12 and the protection component are connected in parallel to stabilize the voltage to prevent the surge current from damaging the LED chip.

The position where the LED chip 12 disposed spans across the first region 111 and the second region 112 of the substrate 11. Furthermore, the LED chip 12 is mostly disposed within the first region 111 of the substrate 11, and a small portion of the LED 12 is located at the second region 112 of the substrate 11 to avoid the LED chip 12 from being located excessively in the second region 112, which can cause the LED chip 12 to be shielded by the hierarchical structure, which is disposed in the subsequent procedure, so as to result in poor light emitting efficiency of the LED package structure 10.

The chip upper surface 121 of the LED chip 12 has a light emitting region 122 and a wire bonding region 123. The light emitting region 122 and the wire bonding region 123 correspond to the first region 111 and the second region 112 of the substrate 11, respectively, and the LED chip 12 includes at least one electrode contact 124 corresponding to at least one electrode pad 113 of the substrate 11.

In step S403, the at least one electrode contact 124 and the at least one electrode pad 113 are electrically connected via at least one metal wire 14. The metal wire 14 may be a gold wire or a copper wire. Any metals capable of being used to electrically connect the electrode contact 124 and the electrode pad 113 may be used to be the metal wire in the present disclosure, and it is not limited thereto. In step S404, a reflective component 13 is provided on the substrate 11 and the LED chip 12 to cover the at least one metal wire 14.

In this embodiment, the reflective component 13 can be molded to cover the LED chip 12. The reflective component 13 is made of an opaque sealing material with reflective particles to improve the light emitting efficiency of the LED chip 12, prevent light leakage of the LED chip 12, and reduce the viewing angle to concentrate the light emission of the LED chip 12.

Figure 5:
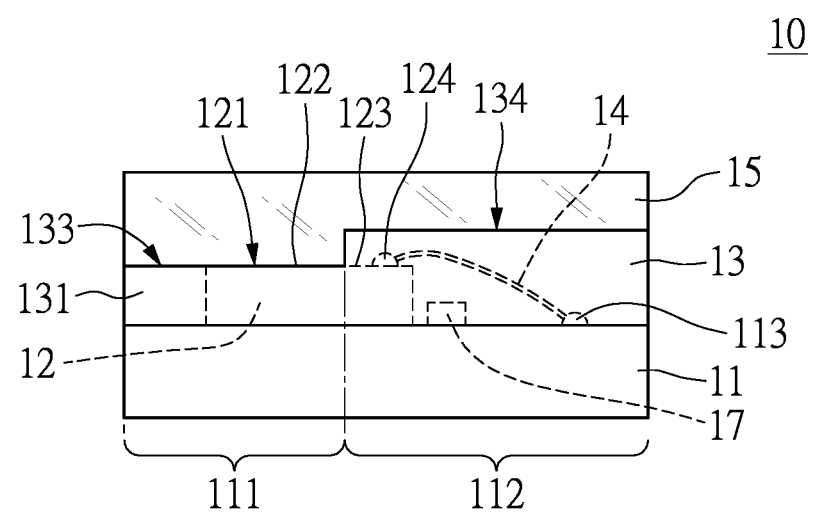
FIG. 5 is another side view of the LED package structure in the embodiment of the present disclosure.

Furthermore, in the present disclosure, the material of the reflective component 13 can be molded into the gap between the LED chips 12 by a molding tool having a height difference, as shown in FIG. 5, so that a stepped structure is formed on the lateral surface of the reflective component 13. That is, an upper molding tool has a cavity at a position corresponding to the second portion 132. When the upper molding tool is pressed onto the LED chip 12, the cavity can be used for accommodating the metal wire 14, and then the resin material is filled at the surrounding area of the LED chip 12 and the cavity so as to form the first portion 131 and the second portion 132.

In addition, in the embodiment of the present disclosure, the method may further include providing a protection component on the substrate 11. The protection component may be disposed at any positions on the substrate 11, and the protection component may be a Zener diode, but it is not limited thereto. Moreover, after the process of disposing the LED chip 12 and the metal wire 14 is finished, a cleaning step may be further included, for example, a plasma treatment can be used to remove contaminants on the substrate 11 or the LED chip 12.

The reflective component 13 includes a first portion 131 and a second portion 132. The first portion 131 of the reflective component 13 surrounds the LED chip 12, and the second portion 132 corresponds to the second region 112 of the substrate 11. The reflective component 13 is stacked and covered on the first portion 131 and the wire bonding region 123. The first portion 131 of the reflective component 13 has the first surface 133, and the first surface 133 of the first portion 131 is flush with the chip upper surface 121 (light emitting region 122) of the LED chip 12, and the second portion 132 has a second surface 134. The second portion 132 of the reflective component 13 is above the highest point of the metal wire 14, so that the second portion 132 can cover the metal wire 14. The metal wire 14 can be electrically connected to the electrode contact 124 and the electrode pad 113 by wire bonding. In some embodiments, when the metal wire 14 is connected to the electrode contact 124 and the electrode pad 113 in a reverse wiring manner, the thickness of the first portion 131 is the same as the LED chip 12, and the thickness of the second portion 132 stacked thereon is preferred to be between 50 and 100 mm. Alternatively, in different embodiments, when the metal wire 14 is connected to the electrode contact 124 and the electrode pad 113 in a forward wiring manner, the thickness of the first portion 131 is the same as the LED chip 12, and the thickness of the second portion 132 stacked thereon is between 150 and 200 mm, but it is not limited thereto.

After the step S404 is completed, some contaminants on the reflective component 13 can be adhered and removed. Furthermore, when the reflective component 13 is formed by the sealant, there will be some remaining glue on the surface of the LED package structure 10. By sticking a tape on the LED chip 12 and then tearing off the tape, the remaining glue can be removed.

After the step of disposing the reflective component 13, the transmissive element 15 can be further disposed on the reflective component 13 and the LED chip 12. The transmissive element 15 is disposed above the light emitting region 122 of the reflective component 13 and the upper surface 121 of the LED chip 12 by molding, and then the phosphor layer 16 is coated on the transmissive element 15.

Alternatively, in different embodiments, the phosphor layer 16 may be coated on the reflective component 13 and the LED chip 12 in advance, and then the reflective component 13 may be disposed on the phosphor layer 16. In addition, the transmissive element 15 can be provided above the first portion of the reflective component and the light emitting region 122 of the chip upper surface 121 of the LED chip 12, and then the phosphor layer 16 is coated on the transmissive element 15. In some preferred embodiments, the method of coating the phosphor layer 16 may include disposing the phosphor layer 16 on the transmissive element 15 by a spraying manner. Alternatively, the phosphor layer 16 may be coated on the reflective component 13 and the LED chip 12 in advance, and then the transmissive element 15 is disposed on the phosphor layer 16 located in the first region 111 of the substrate 11, and it is not limited thereto.

In addition, after the reflective component 13 is disposed, the manufacturing method of the LED package structure provided by the embodiment of the present disclosure may further include a baking step to achieve the purpose of curing the reflective component 13. After the transmissive element 15 is provided, an additional baking step can be performed to cure the transmissive element 15. Finally, a plasma cleaning process can be performed again to remove contaminants on the substrate 11 or the LED chip 12, and then the plurality of completed LED package structures are cut into individual pieces of the LED package structures to complete the manufacturing method of the LED package structure.

Figure 6A:
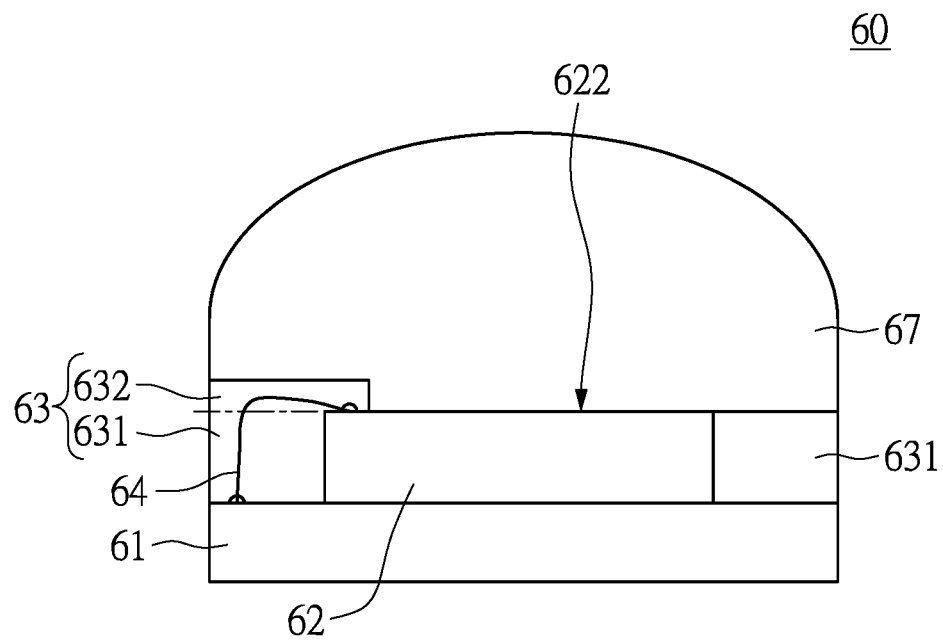
FIG. 6A to FIG. 6K are side views of the LED package structure in another embodiment of the present disclosure.
Figure 6B:
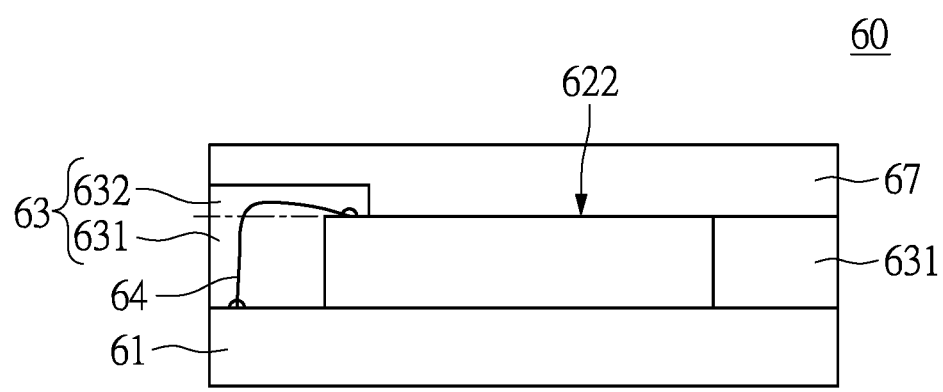

FIG. 6A is a side view of the LED package structure in another embodiment of the present disclosure. As shown in FIG. 6A, in the embodiment of the present disclosure, an LED package structure 60 also includes a substrate 61, an LED chip 62, and a reflective component 63. In this embodiment, the structures or positions of a substrate 61, an LED chip 62, or a reflective component 63 are similar to those components in the aforementioned embodiment, so the related specifications are not described herein again. The reflective component 63 also includes a first portion 631 and a second portion 632. The first portion 631 of the reflective component 63 surrounds the LED chip 62. The second portion 632 corresponds to a second region 612 of the substrate 61, and the second portion 632 is stacked to cover the first portion 631 and the wire bonding region 623 of the LED chip 62. The second portion 632 of the reflective component 63 is above the highest point of the metal wire 64, so that the second portion 632 can cover the metal wire 64. In this embodiment, in order to improve the overall light emitting efficiency of the LED package structure, a lens 67 may be further stacked on the first portion 631, the second portion 632 of the reflective component 63, and a light emitting region 622 of the LED chip 62, and the lens 67 preferably has a domed shape, or in different embodiments, the lens 67 may have a planar shape, as shown in FIG. 6B. The lens 67 is preferably made of a polymer material, and the polymer material may be silicone or epoxy, but it is not limited thereto.

Figure 6C:
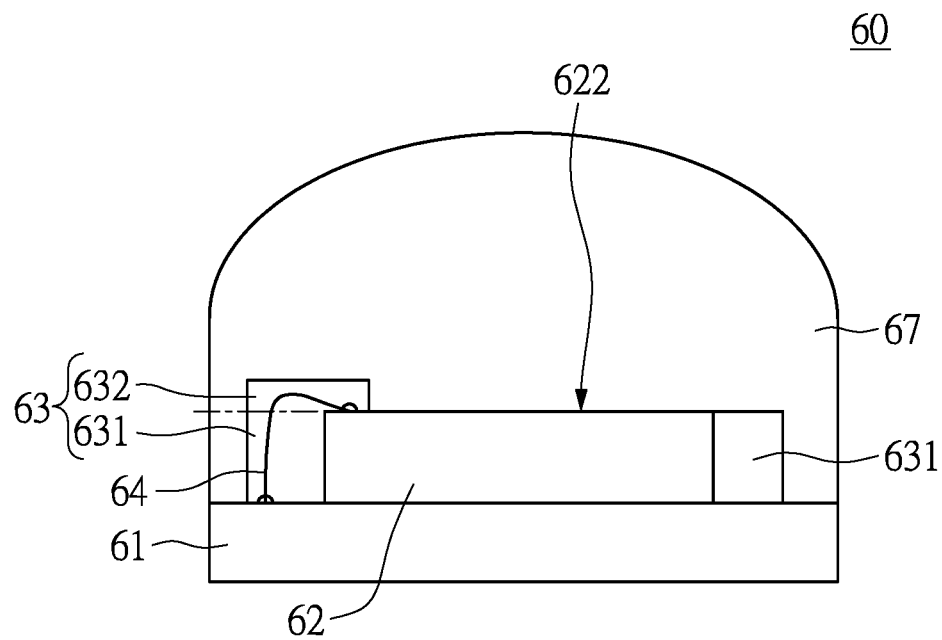

In addition, in this embodiment, as shown in FIG. 6A or FIG. 6B, the width of the first portion 631 of the reflective component 63 plus the width of the LED chip 62 is equal to the width of the substrate 61. However, in different embodiments, the width of the first portion 631 of the reflective component 63 plus the width of the LED chip 62 may be smaller than the width of the substrate 61, as shown in FIG. 6C. In other words, the first portion 631 of the reflective component 63 surrounds the periphery of the LED chip 62, but in this embodiment, the first portion 631 of the reflective component 63 does not fully occupy the remaining surface of the substrate 61 after LED chip 62 is disposed thereon. The lens 67 is stacked on the first portion 631, and the second portion 632 of the reflective component 63, the light emitting region 622 of the LED chip 62, and a portion of the substrate 61. In this embodiment, the width of the lens 67 is the same as the width of the substrate 61.

Figure 6D:
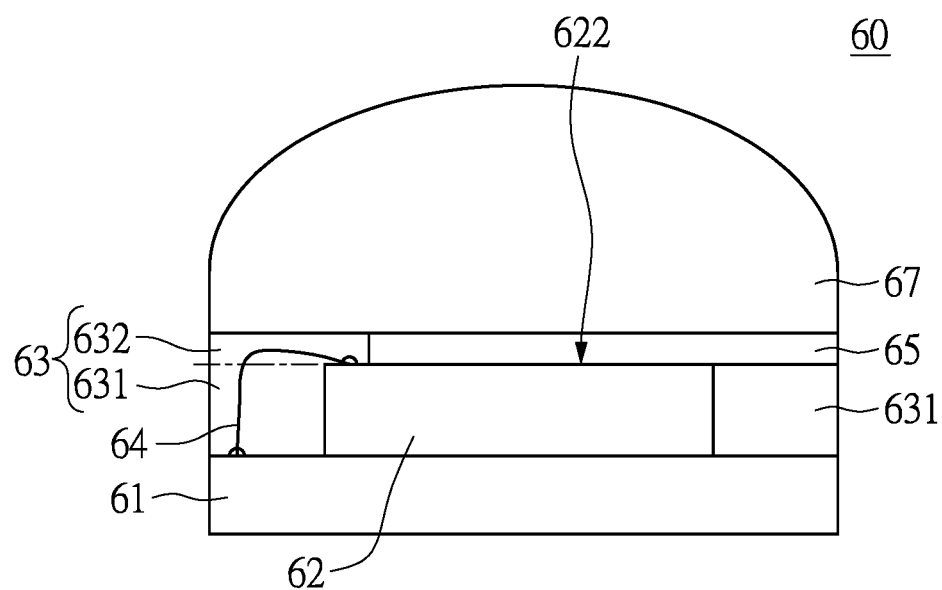
Figure 6E:
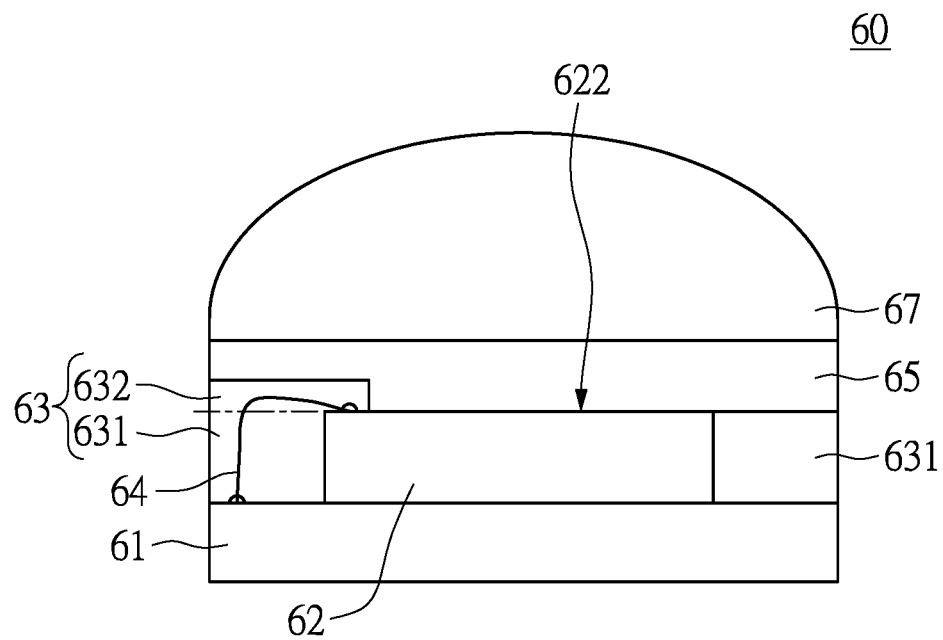
Figure 6F:
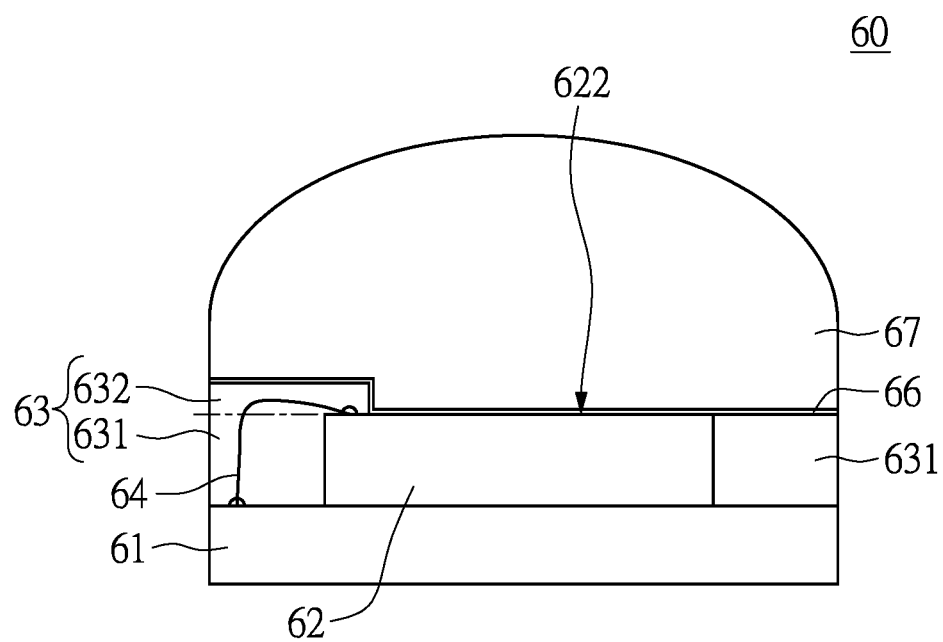
Figure 6G:
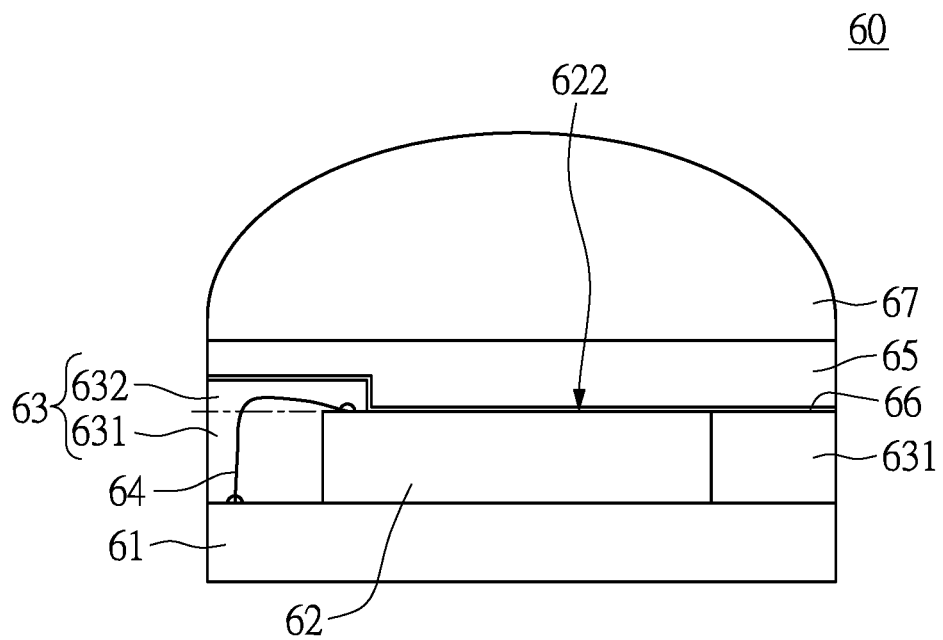
Figure 6H:
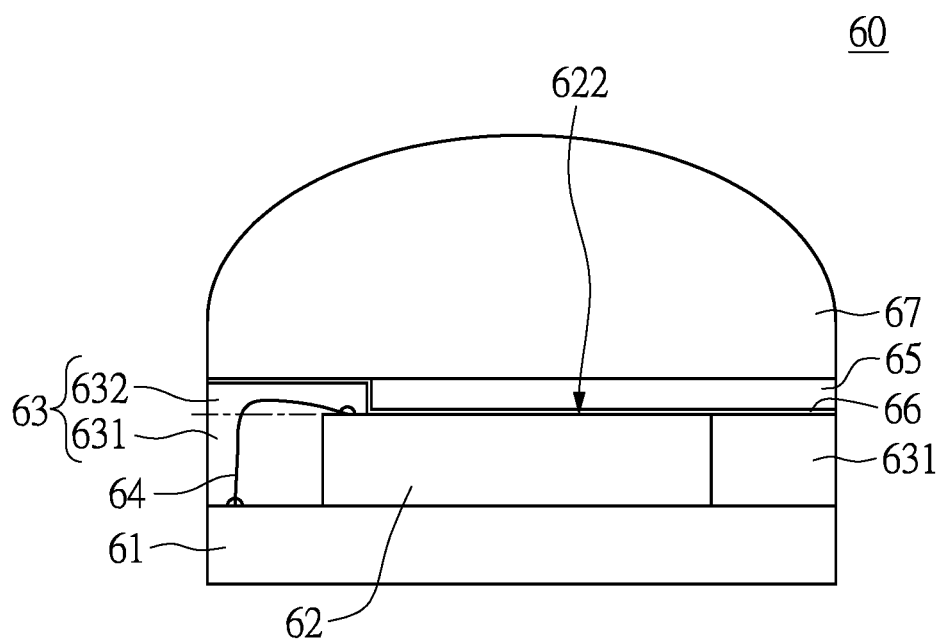

Alternatively, in different embodiments, a transmissive element 65 may be provided on the first light emitting region 622 of the LED chip 62 and the second portion 632 of the reflective component 63 in advance, and then the transmissive element 65 and the lens 67 is provided on the transmissive element 65 and the first portion 631 of the reflective component 63, as shown in FIG. 6D. Or, in different embodiments, the transmissive element 65 covers the first light emitting region 622 of the LED chip 62 and the first portion 631 of the reflective component 63, and further covers the second portion 632 of the reflective component 63, and then the lens 67 is provided on the transmissive element 65, as shown in FIG. 6E. In addition, in different embodiments, a phosphor layer 66 may be provided on the first light emitting region 622 of the LED chip 62 and the second portion 632 of the reflective component 63, and the lens 67 may be directly provided on the phosphor layer 66. As shown in FIG. 6F, no transmissive element 65 is used. Alternatively, in another embodiment, after the phosphor layer 66 is disposed, the transmissive element 65 may be disposed on the phosphor layer 66 in advance, and then the lens 67 may be disposed on the transmissive element 65, as shown in FIG. 6G. As shown in FIG. 6G, the transmissive element 65 may cover the entire surface of the phosphor layer 66, or the transmissive element 65 may cover only the first light emitting region 622 corresponding to the LED chip 62 and the phosphor layer 66 of the second portion 632 of the reflective component 63, as shown in FIG. 6H, but it is not limited thereto.

Figure 6I:
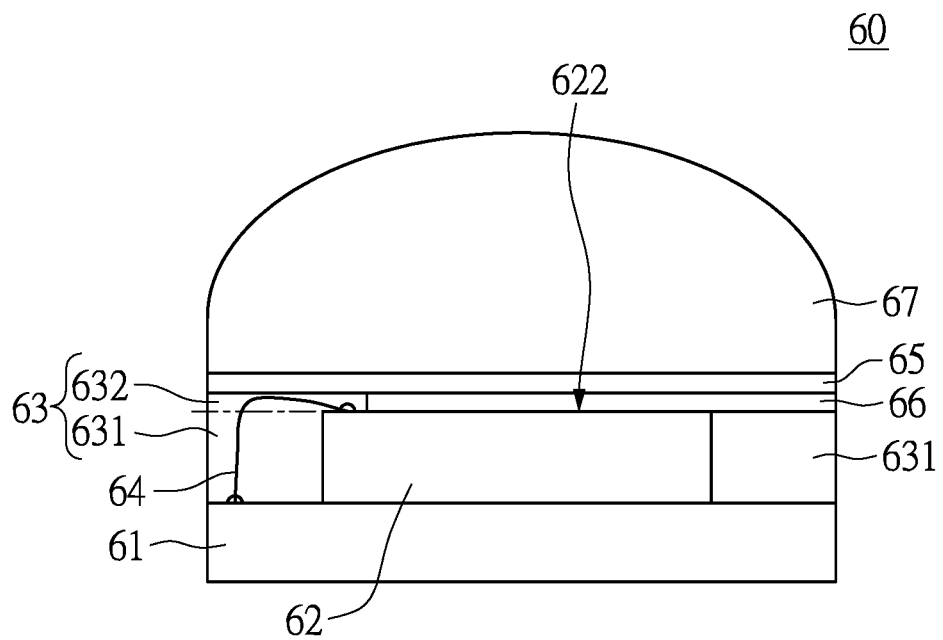

In different embodiments, the phosphor layer 66 may cover the first portion 631 of the reflective component 63 and the light emitting region 622 of the LED chip 62, and the thickness of the phosphor layer 66 is the same as the thickness of the second portion 632 of the reflective component 63, so that the phosphor layer 66 is flush with the second portion 632 of the reflective component 63. The transmissive element 65 is then disposed on the second portion 632 of the reflective component 63 and the phosphor layer 66, and finally the lens 67 is disposed on the transmissive element 65, as shown in FIG. 6I.

Figure 6J:
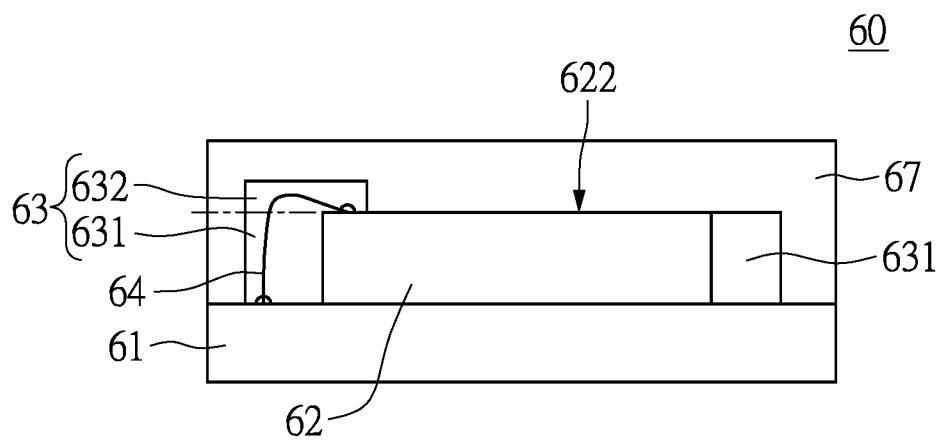
Figure 6K:
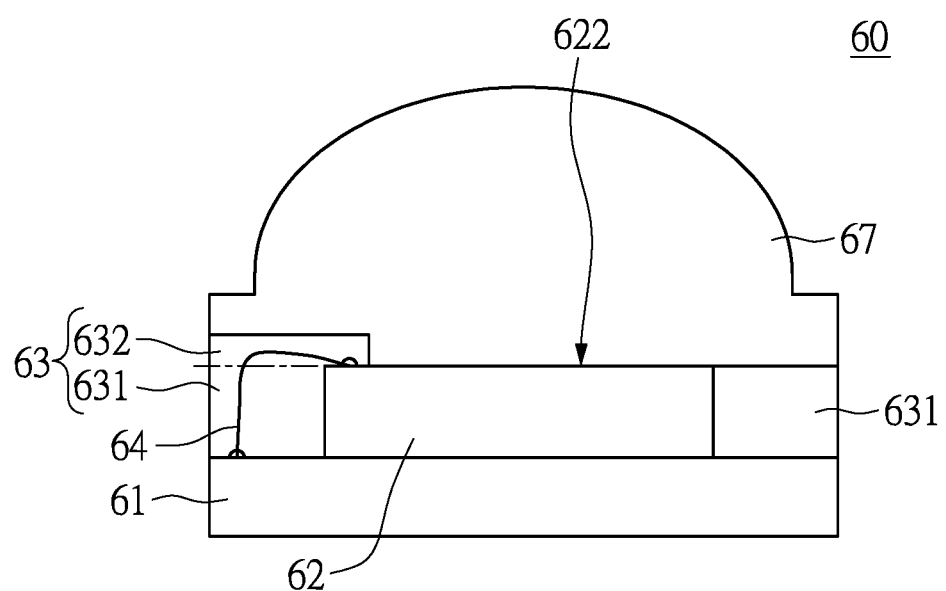

In addition, it should be noted that, in the embodiment of FIGS. 6C to 6I, the lens 67 is the lens 67 with a dome shape as an example. However, in different embodiments, the lens 67 with dome shape may be replaced by the lens 67 with a planar shape or the lens 67 with another shape, but it is not limited thereto. For example, the lens 67 with dome-type of the LED package structure 60 shown in FIG. 6B can be changed to the lens 67 with flat shape as shown in FIG. 6J, and in the other embodiments shown in FIGS. 6C to 6I, The lens 67 with dome-type can also be changed to the lens 67 with plane-type or other kinds of the lens 67, which is not specifically described herein. Further, as shown in FIG. 6K, the lens 67 is also disposed on the first portion 631, the second portion 632 of the reflective component 63, and the light emitting region 622 of the LED chip 62. The lens 67 may have a shape similar to the dome-type lens 67, such as a round cap shape, and can also improve the light emitting efficiency of the LED package structure 60. In addition, the lens 67 may be a Fresnel lens, and the material of the lens 67 may be of glass or polymer material (e.g., silicone, epoxy, polycarbonate (PC), acrylic (PMMA) or polyvinyl chloride (PVC)).

By further installing the lens 67 on the LED package structure 60 of the present disclosure, the central illuminance of the LED package structure 60 can be greatly improved. For example, the LED package structure 60 shown in FIG. 6A is used as an example. For the LED package structure without the lens 67, the central illuminance of the LED package structure 60 shown in FIG. 6A can be increased by 449.2%, or the LED package structure 60 with a lens 67 with round cap shown in FIG. 6K, and the size of the lens 67 is about 900 um×900 um, and the central illuminance of the LED package structure 60 can be increased by 435.7%. Alternatively, when the size of the lens 67 is about 950 um×950 um, the central illuminance of the LED package structure 60 can be slightly increased by 444.7%. Therefore, through the LED package structure 60 of the present disclosure, the light leakage issue can be prevented and the effect of increasing the central illuminance can be achieved.

One of the advantages of the present disclosure is that, the LED package structure 60 and the manufacturing method thereof provided in the present disclosure can effectively prevent light leakage. The reflective component is implemented to cover the metal wire, thereby achieving the effect of protecting the metal wire from breaking. The purpose of narrowing the viewing angle is achieved through the reflective component. In addition, a lens is further installed on the LED package structure to achieve the effect of increasing the central illuminance.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light emitting diode (LED) package structure, comprising:

a substrate having a first region and a second region, and the substrate including at least one electrode pad disposed on the second region;

an LED chip disposed on the substrate and having a chip upper surface with a light emitting region corresponding to the first region and a wire bonding region corresponding to the second region, and the LED chip including at least one electrode contact located at the wire bonding region and electrically connected to the at least one electrode pad via at least one metal wire; and a reflective component including a first portion surrounding the LED chip and a second portion correspondingly disposed on the second region, and the second portion covering a portion of the first region and the wire bonding region;

wherein the first portion includes a first surface being flush with the light emitting region and the second portion includes a second surface above a highest point of the at least one metal wire;

wherein an upper surface of the second portion has a square shape, a rectangle shape, a trapezoid shape or a polygon shape.

2. The LED package structure according to claim 1, further comprising a transmissive element covering the reflective component and the light emitting region.

3. The LED package structure according to claim 1, wherein the reflective component includes reflective particles.

4. The LED package structure according to claim 1, wherein a lateral side of the reflective component is a stepped structure.

5. The LED package structure according to claim 1, wherein a ratio between an area of the wire bonding region and the area of the light emitting region is less than 20%.

6. The LED package structure according to claim 1, wherein one lateral side of the light emitting region has a length equal to one lateral side of the wire bonding region.

7. The LED package structure according to claim 1, further comprising a lens disposed on the light emitting region.

8. The LED package structure according to claim 1, further comprising a transmissive element disposed on the first region and the light emitting region.

9. The LED package structure according to claim 8, wherein the transmissive element has an upper surface flush with the second surface.

10. The LED package structure according to claim 1, further comprising a protection component disposed within the second region, and the reflective component covers the protection component.

11. The LED package structure according to claim 10, wherein the LED chip and the protection component are connected in parallel.

12. The LED package structure according to claim 1, further comprising a phosphor layer covering the LED chip.

13. The LED package structure according to claim 12, further comprising a transmissive element covering the phosphor layer.

14. The LED package structure according to claim 13, wherein the transmissive element is disposed on the first region.

* * * * *